(12) United States Patent
Azize

(10) Patent No.: US 11,309,450 B2
(45) Date of Patent: Apr. 19, 2022

(54) HYBRID SEMICONDUCTOR PHOTODETECTOR ASSEMBLY

(71) Applicant: Analog Devices, Inc., Norwood, MA (US)

(72) Inventor: Mohamed Azize, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/579,428

(22) Filed: Sep. 23, 2019

(65) Prior Publication Data

US 2020/0203549 A1 Jun. 25, 2020

Related U.S. Application Data

(60) Provisional application No. 62/782,914, filed on Dec. 20, 2018.

(51) Int. Cl.
*H01L 31/101* (2006.01)
*H01L 31/112* (2006.01)
(Continued)

(52) U.S. Cl.
CPC ...... *H01L 31/1129* (2013.01); *H01L 29/7786* (2013.01); *H01L 31/03046* (2013.01);
(Continued)

(58) Field of Classification Search
CPC .......................................... H01L 31/10–1896
See application file for complete search history.

(56) References Cited

U.S. PATENT DOCUMENTS

| 4,739,385 A | 4/1988 | Bethea et al. |
| 6,252,287 B1 | 6/2001 | Kurtz et al. |

(Continued)

FOREIGN PATENT DOCUMENTS

| CN | 1516292 A | 7/2004 |
| CN | 1757161 A | 4/2006 |

(Continued)

OTHER PUBLICATIONS

U.S. Appl. No. 16/710,801, filed Dec. 11, 2019, Semiconductor Photodetector Assembly.

(Continued)

*Primary Examiner* — Jae Lee
(74) *Attorney, Agent, or Firm* — Schwegman Lundberg & Woessner, P.A.

(57) ABSTRACT

An inexpensive IR photodetector assembly that can provide high performance in SWIR applications, such as LIDAR. The photodetector assembly can operate as a photodiode, a phototransistor, or can include both a photodiode and a phototransistor. The hybrid photodetector can be composed of one or more absorber layer materials from a first semiconductor family, e.g., p-type InGaAs, laying on one or more wide-band gap semiconductor transducer layer materials from a second semiconductor family, e.g., aluminum gallium nitride (AlGaN) and gallium nitride (GaN), or AlGaN/n-GaN. As such, the absorber layer material and the wide band gap materials can be from two different semiconductor families, making the IR photodetector a hybrid of semiconductor families. After shining IR light onto the absorber layer material, the photo-generated electron-hole pairs can be collected as photocurrent in the photo-voltaic mode.

21 Claims, 14 Drawing Sheets

(51) Int. Cl.
*H01L 31/0304* (2006.01)
*H01L 31/18* (2006.01)
*H01L 31/109* (2006.01)
*H01L 29/778* (2006.01)

(52) U.S. Cl.
CPC ........ *H01L 31/109* (2013.01); *H01L 31/1844* (2013.01); *H01L 31/1856* (2013.01)

(56) References Cited

U.S. PATENT DOCUMENTS

| | | | |
|---|---|---|---|
| 6,326,654 B1 | 12/2001 | Ruden et al. | |
| 6,586,272 B1 | 7/2003 | Song | |
| 6,720,589 B1 | 4/2004 | Shields | |
| 6,849,882 B2 | 2/2005 | Chavarkar et al. | |
| 7,112,860 B2 | 9/2006 | Saxler | |
| 7,705,415 B1* | 4/2010 | Nabet | H01L 31/1035 257/449 |
| 8,143,648 B1* | 3/2012 | Moon | B82Y 20/00 257/79 |
| 8,269,223 B2 | 9/2012 | Wraback et al. | |
| 9,747,752 B2 | 8/2017 | Homer | |
| 10,199,525 B2 | 2/2019 | Nada et al. | |
| 10,447,261 B1* | 10/2019 | Hughes | H01L 31/03044 |
| 2002/0011642 A1 | 1/2002 | Dries et al. | |
| 2008/0128745 A1 | 6/2008 | Mastro et al. | |
| 2009/0159123 A1 | 6/2009 | Kothari et al. | |
| 2014/0070272 A1 | 3/2014 | Knigge et al. | |
| 2014/0252368 A1* | 9/2014 | Lee | H01L 29/4175 257/194 |
| 2016/0190298 A1 | 6/2016 | Wu et al. | |
| 2016/0300973 A1 | 10/2016 | Shen et al. | |
| 2017/0258376 A1 | 9/2017 | Ram et al. | |
| 2019/0115459 A1* | 4/2019 | Kim | H01L 29/2003 |
| 2019/0140120 A1 | 5/2019 | Ma et al. | |
| 2019/0140128 A1* | 5/2019 | Harmon | H01L 27/1443 |
| 2019/0165032 A1* | 5/2019 | Fiorenza | H01L 31/1852 |
| 2019/0187105 A1 | 6/2019 | Ram et al. | |
| 2020/0220036 A1 | 7/2020 | Azize | |
| 2021/0043750 A1* | 2/2021 | Neufeld | H01L 29/205 |

FOREIGN PATENT DOCUMENTS

| | | |
|---|---|---|
| CN | 207320147 U | 5/2018 |
| CN | 109065663 A | 12/2018 |
| GB | 2352087 A | 1/2001 |
| JP | 2010056504 A | 3/2010 |
| JP | 2010056508 | 3/2010 |
| JP | 4635187 B2 | 12/2010 |
| KR | 20170010578 A | 2/2017 |
| WO | 2015131846 | 9/2015 |
| WO | 2020131637 | 6/2020 |
| WO | 2020146093 | 7/2020 |

OTHER PUBLICATIONS

"International Application Serial No. PCT/US2019/066329, International Search Report dated Feb. 18, 2020", 4 pgs.
"International Application Serial No. PCT/US2019/066329, Written Opinion dated Feb. 18, 2020", 7 pgs.
"International Application Serial No. PCT/US2019/066338, International Search Report dated Feb. 18, 2020", 4 pgs.
"International Application Serial No. PCT/US2019/66338, Written Opinion dated Feb. 18, 2020", 7 pgs.
Khan, Fasihullah, "Oxygen desorption kinetics of ZnO nanorod-gated AlGaN GaN HEMT-based UV photodetectors", AIP Advances, vol. 8, No. 7, American Institute of Physics, New York, (Jul. 27, 2018), 14 pgs.
Alpert, Hannah S., et al., "Gallium Nitride Photodetector Measurements of UV Emission from a Gaseous CH4/O2 Hybrid Rocket Igniter Plume", IEEE Aerospace Conference, (2019), 7 pgs.
Chang, S.J., "Nitride-based 2DEG photodetectors with a large AC responsivity", Solid-State Electronics, 47(11), (2003), 2023-2026.
Huang, Y., "Photocurrent characteristics of two-dimensional-electron-gas-based AlGaN/GaN metal-semiconductor-metal photodetectors", Applied Physics Letters, 96(24), (2010), 4 pgs.
Satterthwaite, Peter F., et al., "High Responsivity, Low Dark Current Ultraviolet Photodetectors Based on Two-Dimensional Electron Gas Interdigitated Transducers", ACS Photonics, Article ASAP, URL: https://pubs.acs.org/doi/abs/10.1021/acsphotonics.8b01169, (Oct. 2018), 6 pgs.
Zaidi, Zaffar, "Applications of GaN HFETs in UV detection and Power electronics", Doctorate Thesis in Electronics and Electrical Engineering at the University of Sheffield, UK, (Nov. 2014), 169 pgs.
"U.S. Appl. No. 16/710,801, Non Final Office Action dated Jan. 4, 2021", 11 pgs.
"U.S. Appl. No. 16/710,801, Response filed Mar. 29, 2021 to Non Final Office Action dated Jan. 4, 2021", 11 pgs.
"U.S. Appl. No. 16/710,801, Notice of Allowance dated Dec. 6, 2021", 8 pgs.
"U.S. Appl. No. 16/710,801, Response filed Nov. 16, 2021 to Advisory Action dated Nov. 3, 2021", 7 pgs.
"U.S. Appl. No. 16/710,801, Final Office Action dated Jul. 26, 2021", 13 pgs.
"U.S. Appl. No. 16/710,801, Response filed Sep. 22, 2021 to Final Office Action dated Jul. 26, 2021", 12 pgs.
"International Application Serial No. PCT/US2019/066329, International Preliminary Report on Patentability dated Jul. 22, 2021", 9 pgs.
"International Application Serial No. PCT/US2019/066338, International Preliminary Report on Patentability dated Jul. 1, 2021", 9 pgs.
"U.S. Appl. No. 16/710,801, Advisory Action dated Nov. 3, 2021", 7 pgs.

* cited by examiner

HYBRID SEMICONDUCTOR PHOTODETECTOR ASSEMBLY

CLAIM OF PRIORITY

This application claims the benefit of priority of U.S. Provisional Patent Application Ser. No. 62/782,914, titled "HYBRID SEMICONDUCTOR PHOTODETECTOR ASSEMBLY" to Mohamed Azize, filed on Dec. 20, 2018, the entire contents of which being incorporated herein by reference.

FIELD OF THE DISCLOSURE

This document pertains generally, but not by way of limitation, to photodetector assemblies and methods.

BACKGROUND

A photodiode is typically a PN junction or PIN structure. When a photon of sufficient energy strikes the diode, it can create an electron-hole pair. This mechanism is also known as the inner photoelectric effect. If the absorption occurs in the junction's depletion region, or one diffusion length away from it, these carriers are swept from the junction by the built-in electric field of the depletion region. Thus, holes move toward the anode, and electrons move toward the cathode, and a photocurrent is produced.

When used in zero bias or photovoltaic mode, the flow of photocurrent out of the device is restricted and a voltage builds up. When used in photoconductive mode, the diode is often reverse-biased (with the cathode driven positive with respect to the anode). This can reduce the response time because the additional reverse bias can increase the width of the depletion layer, which can decrease the junction's capacitance. The reverse bias also increases the dark current without much change in the photocurrent. For a given spectral distribution, the photocurrent is linearly proportional to the illuminance (and to the irradiance).

SUMMARY OF THE DISCLOSURE

This disclosure is directed to, among other things, techniques to provide an inexpensive IR photodetector assembly that can provide high performance in short-wave infrared (SWIR) applications, such as LIDAR. The photodetector assembly can operate as a photodiode, a phototransistor, or can include both a photodiode and a phototransistor. The hybrid photodetector described in this disclosure can reduce the cost factor of conventional InGaAs photodetectors by more than ten while maintaining high performance for SWIR applications such as LIDAR.

A non-limiting overview of certain aspects of the present subject matter follows immediately below.

Aspect 1 can include or use a semiconductor photodetector assembly configured to operate in response to light received at one or more input wavelengths, the assembly comprising: a semiconductor absorber layer material configured to receive the light at the one or more input wavelengths and generate electron-hole pairs, wherein the absorber layer material includes material from a first semiconductor family; and a wide band gap semiconductor transducer layer material coupled to the absorber layer material, wherein the transducer layer material is configured to collect electrons from the absorber layer material and form a two-dimensional electron gas (2DEG) channel, and wherein the transducer layer material is from a second semiconductor family different from the first semiconductor family.

Aspect 2 can include or use, or can optionally be combined with Aspect 1 such that the one or more input wavelengths including infrared (IR) light.

Aspect 3 can include or use, or can optionally be combined with one or any combination of Aspects 1 through 2 such that the one or more input wavelengths include wavelengths of 1.5 micrometers and greater.

Aspect 4 can include or use, or can optionally be combined with one or any combination of Aspects 1 through 3 such that the absorber layer material includes gallium arsenide and the transducer layer material includes gallium nitride.

Aspect 5 can include or use, or can optionally be combined with one or any combination of Aspects 1 through 4 such that the absorber layer further includes indium.

Aspect 6 can include or use, or can optionally be combined with one or any combination of Aspects 1 through 5 such that the transducer layer material further includes aluminum.

Aspect 7 can include or use, or can optionally be combined with one or any combination of Aspects 1 through 7 such that the transducer layer material is a first transducer layer material, the assembly further comprising: a second transducer layer material coupled to the first transducer layer material, the second transducer layer material including gallium nitride; and a substrate material coupled to the second transducer layer material.

Aspect 8 can include or use, or can optionally be combined with one or any combination of Aspects 1 through 7 such that the absorber layer material includes gallium arsenide and the transducer layer material does not include gallium arsenide.

Aspect 9 can include or use, or can optionally be combined with one or any combination of Aspects 1 through 8 such that the transducer layer material is a first transducer layer material, the assembly further comprising: a first contact material coupled to an interface between the first transducer layer material and the second transducer layer; a second contact material spaced apart from the first contact material, the second contact material coupled to the interface, wherein the 2DEG channel includes a plurality of interdigitated 2DEG channels extending partially from one of the first contact material and the second contact material to the other of the first contact material and the second contact material.

Aspect 10 can include or use, or can optionally be combined with one or any combination of Aspects 1 through 9 such that the photodetector assembly includes a photodiode.

Aspect 11 can include or use, or can optionally be combined with one or any combination of Aspects 1 through 10 such that the photodetector assembly includes a phototransistor.

Aspect 12 can include or use, or can optionally be combined with one or any combination of Aspects 1 through 11 such that the photodetector assembly includes a photodiode and a phototransistor.

Aspect 13 can include or use, or can optionally be combined with one or any combination of Aspects 1 through 12 to use or include a back barrier layer material coupled between the transducer layer material and a substrate layer.

Aspect 14 can include or use, or can optionally be combined with one or any combination of Aspects 1 through 13 such that the back barrier layer material includes aluminum nitride.

Aspect 15 can include or use a method of forming a semiconductor photodetector assembly configured to receive light at one or more wavelengths, the method comprising: coupling a wide band gap semiconductor transducer layer material to a substrate material, wherein the transducer layer material is from a first semiconductor family; and coupling a semiconductor absorber layer material to the transducer layer material, the absorber layer material configured to receive the light at the one or more input wavelengths and generate electron-hole pairs, wherein the absorber layer material includes material from a second semiconductor family different from the first semiconductor family.

Aspect 16 can include or use, or can optionally be combined with one or any combination of Aspects 1 through 15 such that the absorber layer material includes gallium arsenide and the transducer layer material includes gallium nitride.

Aspect 17 can include or use, or can optionally be combined with one or any combination of Aspects 1 through 16 such that the absorber layer further includes indium.

Aspect 18 can include or use, or can optionally be combined with one or any combination of Aspects 1 through 17 such that the transducer layer material further includes aluminum.

Aspect 19 can include or use a semiconductor photodetector assembly configured to operate in response to light received at one or more input wavelengths, the assembly comprising: means for receiving the light at the one or more input wavelengths and generate electron-hole pairs, wherein the means for receiving includes material from a first semiconductor family; and means for collecting electrons from the means for receiving, the means for collecting coupled to the means for receiving, wherein the means for collecting electrons is configured to form a two-dimensional electron gas (2DEG) channel, and wherein the means for collecting is from a second semiconductor family different from the first semiconductor family.

Aspect 20 can include or use, or can optionally be combined with one or any combination of Aspects 1 through 18 such that the photodetector assembly includes one or both of a photodiode and a phototransistor.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Photodetectors can be combined into image sensing devices, such as focal plane arrays (FPAs), and used in numerous automobile, space, and military applications. For example, one application includes remote sensing using light pulses emitted for example by lasers and reflected by distant objects can be referred to as LIDAR (light detection and ranging). A LIDAR receiver can include an optical receiver having a photodiode (PD) as a receiving element, and a transimpedance amplifier (TIA), for example a shunt-feedback amplifier, which converts the photocurrent from the receiving photodiode into a voltage.

LIDAR systems can use short-wave infrared light (SWIR), such as wavelengths greater than about 1 micrometer (µm) to about 3 µm. In these applications, conventional photodetectors use indium gallium arsenide (InGaAs), photodiode (PDs) for achieving high performance at a wavelength of about 1.5 µm. However, the high cost of InGaAs PDs have delayed their adoption in different consumer markets, e.g. automobile, electronics consumers, etc.)

The present inventor has recognized a need for an inexpensive IR photodetector assembly that can provide high performance in SWIR applications, such as LIDAR. The photodetector assembly can operate as a photodiode, a phototransistor, or can include both a photodiode and a phototransistor. The hybrid IR photodetector described in this disclosure can reduce the cost factor of conventional InGaAs photodetectors by more than ten while maintaining high performance for SWIR applications such as LIDAR.

The hybrid IR photodetector device structure can be composed of one or more absorber layer materials from a first semiconductor family, e.g., p-type InGaAs, laying on one or more wide-band gap semiconductor transducer layer materials from a second semiconductor family, e.g., aluminum gallium nitride (AlGaN) and gallium nitride (GaN), or AlGaN/n-GaN. As such, the absorber layer material and the wide band gap materials can be from two different semiconductor families, making the IR photodetector a hybrid of semiconductor families. After shining IR light onto the absorber layer material, the photo-generated electron-hole pairs can be collected as photocurrent in the photo-voltaic mode.

The hybrid photodetector can be considered to be a phototransistor (a type of photodetector having a conductor channel with an optically controlled gate), photoconductor, metal-semiconductor-metal (MSM), or a photodiode, e.g., a Schottky diode or PIN diode. The hybrid photodetector can be operated in photo-voltaic mode (e.g., no bias) or in photo-conductive mode (e.g., by using a bias) to achieve higher performance.

Figure 1:
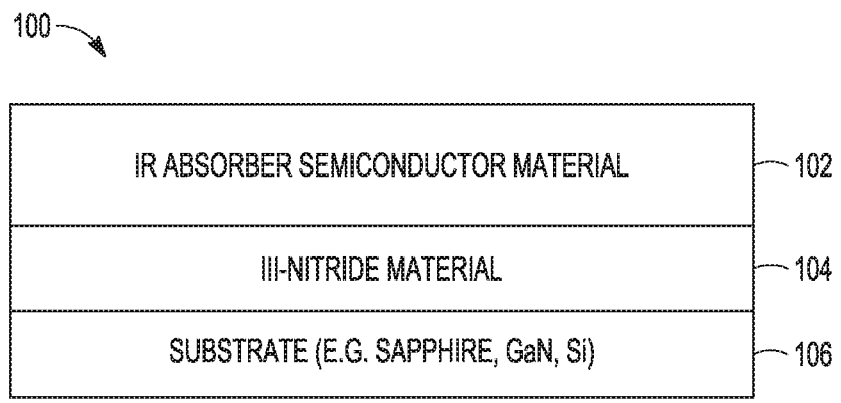
FIG. 1 is a conceptual diagram depicting an example of a structure of a hybrid semiconductor photodetector assembly in accordance with various techniques of this disclosure.

FIG. 1 is a conceptual diagram depicting an example of a structure of a hybrid semiconductor photodetector assembly 100 in accordance with various techniques of this disclosure. An absorber layer material 102 can include one or more absorber semiconductor materials. For example, the absorber layer material 102 can absorb one or more input wavelengths that include at least infrared (IR) light. In some example implementations, the absorber layer material 102 can absorb one or more input wavelengths that include wavelengths of about 1.5 µm and greater.

The absorber layer material 102 can include the III-V compound semiconductor materials obtained by combining group III elements, e.g., Al, Ga, In, with group V elements, e.g., N, P, As, Sb. For example, the absorber layer material 102 can include gallium arsenide, such as indium gallium arsenide (InGaAs), e.g., p-type InGaAs. The combination of the group III elements and the group V elements can form a first semiconductor family. The absorber layer material 102 can absorb IR light, for example, and convert the absorbed light into excitor's, e.g., electron-hole pairs.

In some example implementations, the gallium arsenide, e.g., InGaAS, absorber layer material 102 can include nitrogen, e.g., InGaAsN. For example, nitrogen can be added to the absorber layer material 102 for visible light detection and can improve detection at 1.3 µm, for example, by having a quantum well of GaAs/InGaAsN/GaAs. Thus, the absorber layer material 102 can be $In_xGa_yAs_zN_t$ or $In_xGa_yAs_z$, for example.

In some example implementations, the absorber layer material 102, e.g., of InGaAsN, can be sandwiched between two layers, e.g. GaAs/InGaAsN/GaAs, or multiple quantum wells, e.g., 10×GaAs/InGaAsN/GaAs. The barrier material, e.g., GaAs, can be a semiconductor material with a higher band gap than InGaAsN such as GaAs, GaN, AlN, BN, InGaAsP, InP, etc.

The absorber layer material 102 can be deposited on a wide band gap semiconductor transducer layer material 104 coupled to the absorber layer material 102. The wide band gap semiconductor transducer layer material 104 can be formed from a different combination of the group III elements and the group V elements to form a second semiconductor family different from the first semiconductor family of the absorber layer material 102. The wide band gap semiconductor transducer layer material 104 can be a nitride material, for example, and can include one or more nitride material layers, such as aluminum gallium nitride (AlGaN) and gallium nitride (GaN). Both AlGaN and GaN are wide band gap materials, e.g., about 3.4 electron volts (eV) to about 6.2 eV. The band gap of AlGaN can be adjusted by adjusting the content of the aluminum.

The wide band gap semiconductor transducer layer material 104 can operate as a transducer. For example, the wide band gap semiconductor transducer layer material 104 can collect photo-electrons from the absorber layer material 102 at the AlGaN/GaN interface as a two-dimensional electron gas (2DEG) due to a combination of an internal electric field present in the wide-band gap semiconductor and due to the favorable energy band alignment between the absorber and wide-band gap material layers. The 2DEG may form a conductive channel of electrons that may be controllably depleted, such as by gate voltage metal contact disposed above the channel, to control a current through the semiconductor assembly.

In an example implementation, the semiconductor assembly 100 may be a field effect transistor, such as a high electron mobility transistor (HEMT), having source and drain terminals electrically coupled to a channel formed by a 2DEG, and a gate terminal disposed above the channel. A voltage on the gate terminal, determined relative to a voltage on the drain terminal, may induce an electric field into the channel to control the concentration of free electrons in the 2DEG, such as to control a flow of current through the transistor.

The wide band gap semiconductor transducer layer material 104 can be deposited on a substrate 106, e.g., sapphire, silicon (Si), or GaN.

The term "couple" in this disclosure should not be interpreted as being limited only to direct connections between two components, devices, or materials (or "elements" collectively) can also refer to an indirect relationship in which two elements are separated by one or more intermediary elements such that a path exists between the two elements which includes the intermediary element(s).

Figure 2:
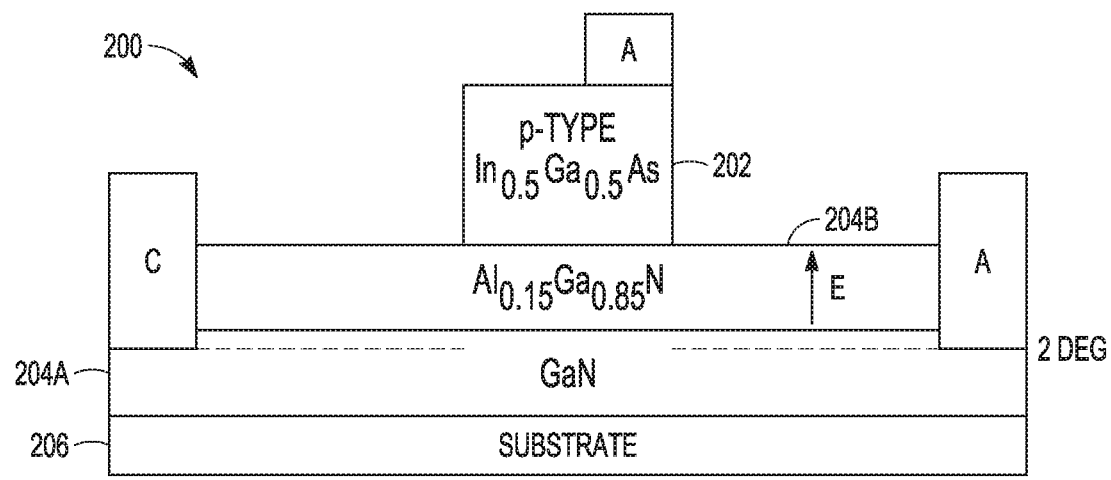
FIG. 2 is an example of a structure of a hybrid semiconductor photodetector assembly that can be used as a photodiode and/or a phototransistor in accordance with various techniques of this disclosure.

FIG. 2 is an example of a structure of a hybrid semiconductor photodetector assembly 200 that can be used as a photodiode and/or a phototransistor in accordance with various techniques of this disclosure. The assembly 200 can include a substrate layer 206, e.g., sapphire, silicon (Si), or GaN.

Over the substrate layer 206, one or more wide band gap semiconductor transducer layer materials formed from a combination of the group III elements and the group V elements to form a first semiconductor family can be deposited. For example, a gallium nitride (GaN) first transducer layer 204A can be deposited over the substrate layer 206, and another gallium nitride second transducer layer 204B, such as aluminum gallium nitride, e.g., $(Al_xGa_{(1-x)}N)$ can be deposited over the GaN layer 204A.

In the example configuration shown in FIG. 2, the aluminum content ("X") is 15% and the gallium content ("1−X") is 85%. Adjusting the aluminum content and its layer thickness can modulate the strength of the electric field E in the AlGaN/GaN layer. For example, aluminum content of about 30% with a thickness greater than 2 nanometers (nm) can result in electrons in the GaN channel layer, whereas an aluminum content of about 15% with a thickness of 2 nm or less can result in no presence of electrons in the GaN channel layer. The techniques of this disclosure can be used with an aluminum content of between about 0% and about 100% to modulate the electron concentration in the GaN channel layer localized at the AlGaN/GaN interface.

Over the one or more wide band gap semiconductor transducer layer materials, e.g., over the GaN layer 204A and the $Al_xGa_{(1-x)}N$ layer 204B, an absorber layer material 202 can be deposited. The absorber layer material 202 can be formed from a different combination of the group III elements and the group V elements to form a second semiconductor family different from the first semiconductor family of the wide band gap semiconductor transducer layer material(s) 204A, 204B. For example, the absorber layer material 202 can include gallium arsenide, such as indium gallium arsenide, e.g., p-type $In_YGa_{(1-Y)}As$. In some examples, the absorber layer material 202 can include gallium arsenide and the transducer layer material(s) do not include gallium arsenide.

The absorber layer 202 can be intrinsically doped or extrinsically doped with N and/or P dopants. In the example configuration shown in FIG. 2, the indium content ("Y") is shown as 50% and the gallium content ("1−Y") is 50%. In some implementations, the p-type $In_YGa_{(1-Y)}As$ material of the absorber layer 202 can have a band gap range of about 0.2 eV to about 1.5 eV. By using an indium content of about 50% and the gallium content of about 50%, a band gap of about 0.7 eV can result, which can be used for wavelengths around 1.5 µm. The percentages of indium content and gallium content can be varied to configure the assembly to operate at wavelengths greater than 1.5 µm or less than 1.5 µm.

As seen in FIG. 2, a 2DEG channel can be formed at the AlGaN/GaN interface due to a combination of the internal electric field E present in the wide-band gap semiconductor and due to the favorable energy band alignment between the absorber and wide-band gap material layers allowing the transfer of photo-carriers into the GaN channel.

One or more contacts can be formed on the assembly 200. In some example configurations, an optional first contact material A can be deposited on or otherwise coupled to the absorber layer material 202, e.g., to form an anode contact. A second contact material C can be formed at or otherwise coupled to the interface between the first transducer layer material and the second transducer layer, e.g., an AlGaN/GaN interface. A third contact material C/A can be spaced apart from the second contact material C and formed or otherwise coupled to the interface between the first transducer layer material and the second transducer layer, e.g., an AlGaN/GaN interface.

In configurations that do not include the first contact material A, the second and third contact materials C and C/A can be used to form a cathode and an anode of the photodiode assembly 200. The contact materials C and A can be Schottky or ohmic contact materials by directly contacting the 2DEG.

Figure 3A:
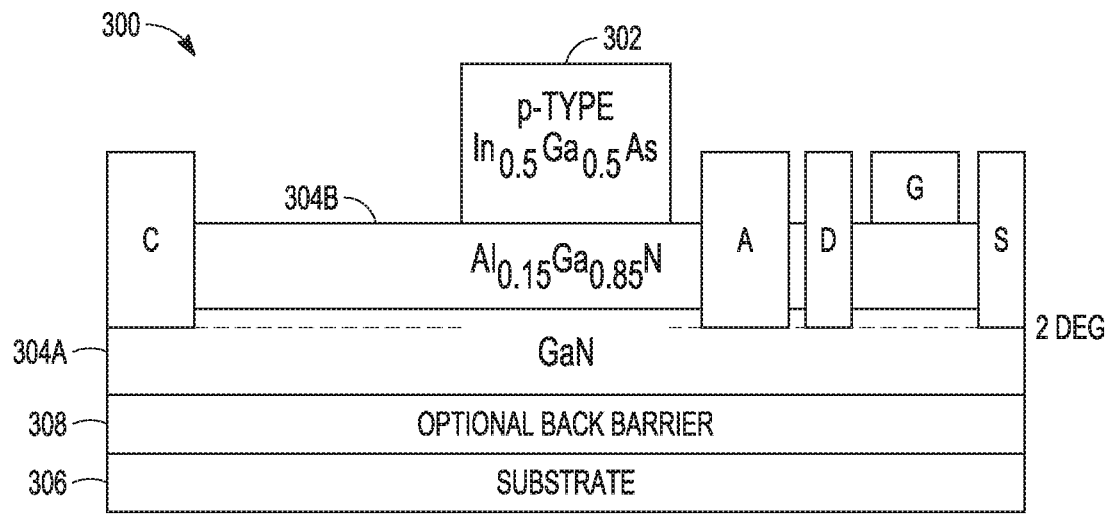
FIG. 3A is cross-sectional view on an example of a hybrid semiconductor photodetector assembly in accordance with various techniques of this disclosure.

FIG. 3A is cross-sectional view on an example of a hybrid semiconductor photodetector assembly in accordance with various techniques of this disclosure. As seen in FIG. 3A, a hybrid semiconductor photodetector assembly 300, e.g., a 2DEG MSM photodetector, configured to operate in response to light received at one or more input wavelengths can include an absorber layer material 302. The absorber layer material 302 can include the III-V compound semiconductor materials obtained by combining group III elements, e.g., Al, Ga, In, with group V elements, e.g., N, P, As, Sb. For example, the absorber layer material 302 can include gallium arsenide, such as indium gallium arsenide (InGaAs), e.g., p-type $In_YGa_{(1-Y)}As$. The combination of the group III elements and the group V elements can form a first semiconductor family. The absorber layer material 302, e.g., p-type $In_YGa_{(1-Y)}As$, can be deposited over the one or more wide band gap semiconductor transducer layer materials, e.g., over the GaN layer 304A and the $Al_XGa_{(1-X)}N$ layer 304B.

The wide band gap semiconductor transducer layer materials 304A, 304B can be formed from a different combination of the group III elements and the group V elements to form a second semiconductor family different from the first semiconductor family of the absorber layer material 302. The wide band gap semiconductor transducer layer material 304A, 304B can be a nitride material, for example, and can include one or more nitride material layers, such as aluminum gallium nitride (AlGaN) and gallium nitride (GaN). In some examples, the absorber layer material 202 can include gallium arsenide and the transducer layer material(s) do not include gallium arsenide.

A 2DEG channel can be formed at the AlGaN/GaN interface. A substrate layer 306 can be included.

The photodetector assembly 300 can operate as a photodiode, a phototransistor, or both. In an example of a photodiode configuration, a first contact material C, cathode contact, and a second contact material A, e.g., anode contact, spaced-apart from the first contact material C can be formed at or otherwise coupled to the AlGaN/GaN interface so as to electrically contact the 2DEG channel. Another contact material C can be formed at or otherwise coupled to the AlGaN/GaN interface.

In some example implementations, the assembly 300 can further include an optional back barrier layer 308 coupled between a transducer layer material, e.g., transducer layer material 304A, and a substrate layer, e.g., substrate layer 306. The optional back barrier layer 308 can have a higher band gap than the GaN layer and can help ensure that electrons stay at the AlGaN/GaN interface. As an example, the optional back barrier layer 308 can include aluminum nitride (AlN), which can have a band gap of about 6.2 eV. A substrate layer 306 can be included below the optional back barrier layer 308.

In an example of a phototransistor configuration, a third contact material D, e.g., a drain contact, and a fourth contact material S, e.g., a source contact, can be formed at the AlGaN/GaN interface so as electrically contact the 2DEG channel.

A fifth contact material G, e.g., a gate contact, can be formed on the wide band gap semiconductor transducer layer, e.g., on the $Al_XGa_{(1-X)}N$ layer 304B.

In some example configurations, the assembly 300 can include both a photodiode and a phototransistor. For example, the assembly can include the five contacts shown in FIG. 3A.

Figure 3B:
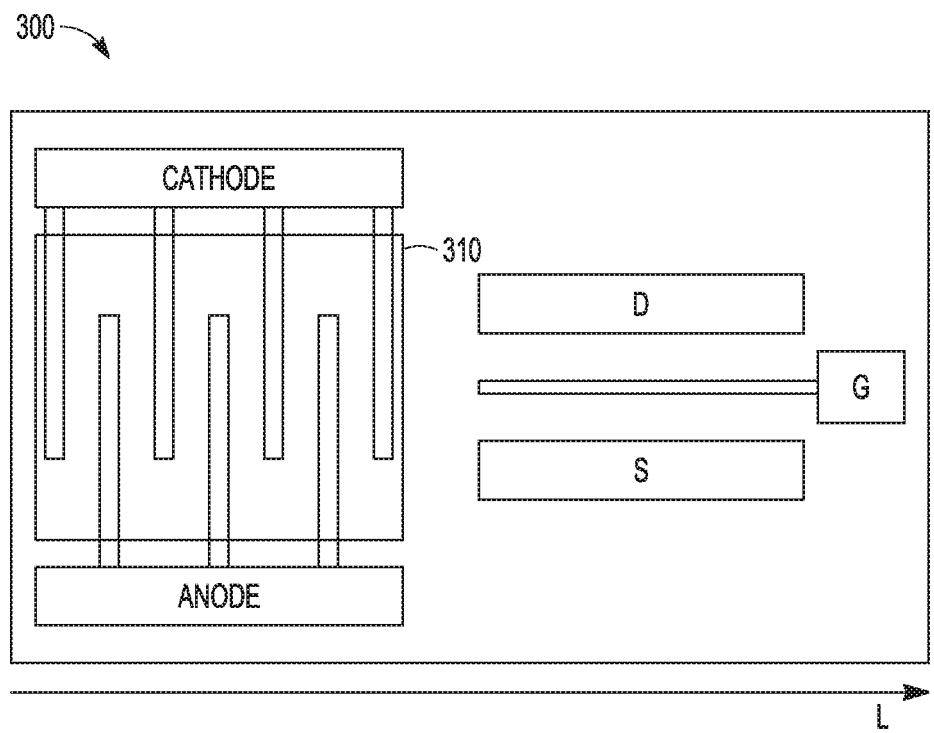
FIG. 3B is plan view on the example of a hybrid semiconductor photodetector assembly of FIG. 3A.

FIG. 3B is plan view on the example of a hybrid semiconductor photodetector assembly 300 of FIG. 3A. In the example configuration shown in FIG. 3B, the assembly 300 can include a plurality of fingers 310, e.g., made of semiconductor material. Each finger 310 can be positioned within the 2DEG channel (shown in FIG. 3A) and can extend partially from one of the first contact, e.g., cathode, and the second contact, e.g., anode, to the other of the first contact and the second contact. In the example shown, the fingers 310 are interdigitated.

A signal can be detected at the end of the fingers 310. Including multiple fingers 310 can help amplify the signal between the first and second contacts. In some approaches, the fingers 310 can be coated with a metal to reduce the series resistance and thus the voltage drop across each finger. The metal on top of the semiconductor material, however, can reflect the incident light, which can reduce the absorption of light and thus the efficiency of the photodetector.

In another approach, rather than use metal fingers that can reflect a portion of the received light, one or more of the fingers 310 can utilize the 2DEG channel as buried semi-metal. By using a buried semi-metal layer to form the fingers 310 instead of using a metal on the top surface of a semiconductor, the surface area for detection can be increased and thus improve the absorption of light. An example of an approach is described in "High Responsivity, Low Dark Current Ultraviolet Photodetectors Based on Two-Dimensional Electron Gas Interdigitated Transducers," by Peter Satterthwaite, et al., ACS Photonics, published Oct. 1, 2018, the entire contents being incorporated herein by reference.

Spaced apart from the photodiode along a length L, the assembly 300 depicts the contact materials forming the drain D, gate G, and source S of a phototransistor. The assembly 300 can be formed with one or both of the photodiode and the phototransistor.

Figure 4A:
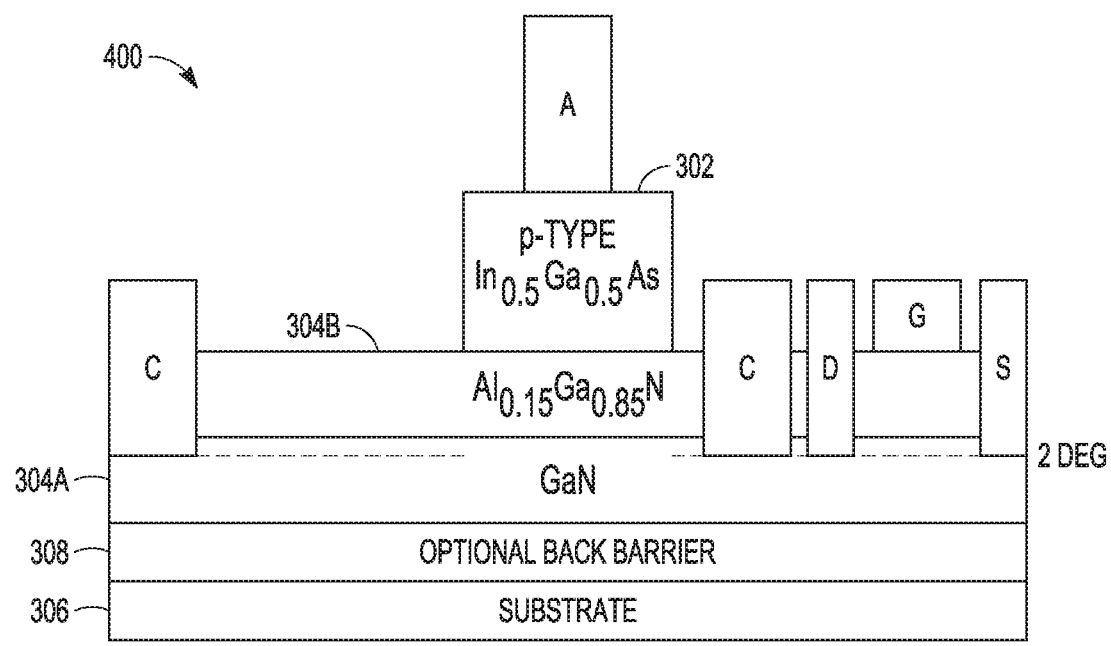
FIG. 4A is cross-sectional view on another example of a hybrid semiconductor photodetector assembly in accordance with various techniques of this disclosure.

FIG. 4A is cross-sectional view on another example of a hybrid semiconductor photodetector assembly in accordance with various techniques of this disclosure. The assembly 400 of FIG. 4A can include the features of the assembly of FIG. 3A and, for purposes of conciseness, will not be described in detail again. In addition, the assembly 400 of FIG. 4A can include additional sixth contact material A, e.g., anode contact, over the absorber layer material 302, e.g., p-type $In_YGa_{(1-Y)}As$. In such a configuration, the second contact material A of FIG. 3A can be used in FIG. 4A as a cathode contact material C. Including the sixth contact material A can improve the response time of the photodetector assembly 400.

Figure 4B:
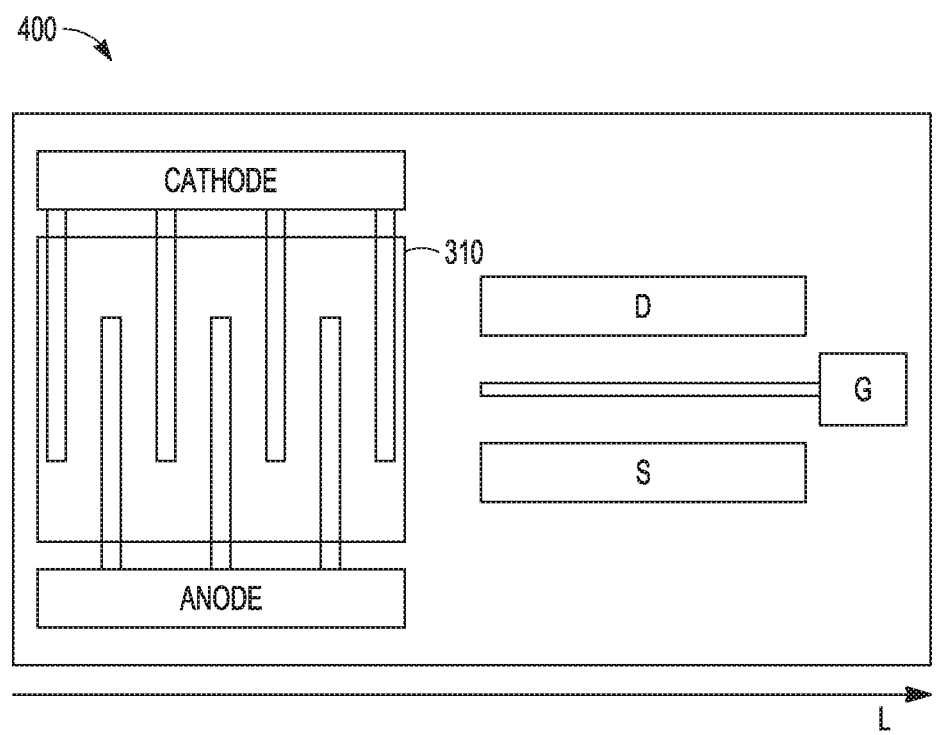
FIG. 4B is plan view on the example of a hybrid semiconductor photodetector assembly of FIG. 4A.

FIG. 4B is plan view on the example of a hybrid semiconductor photodetector assembly 400 of FIG. 4A. The assembly 400 of FIG. 4B can include the features of the assembly of FIG. 3B and, for purposes of conciseness, will not be described in detail again. In addition, the assembly 400 of FIG. 4B can include an additional sixth contact material A, e.g., anode contact, as described above with respect to FIG. 4A.

Spaced apart from the photodiode along a length L, the assembly 400 depicts the contact materials forming the drain D, gate G, and source S of a phototransistor. The assembly 400 can be formed with one or both of the photodiode and the phototransistor.

Figure 5:
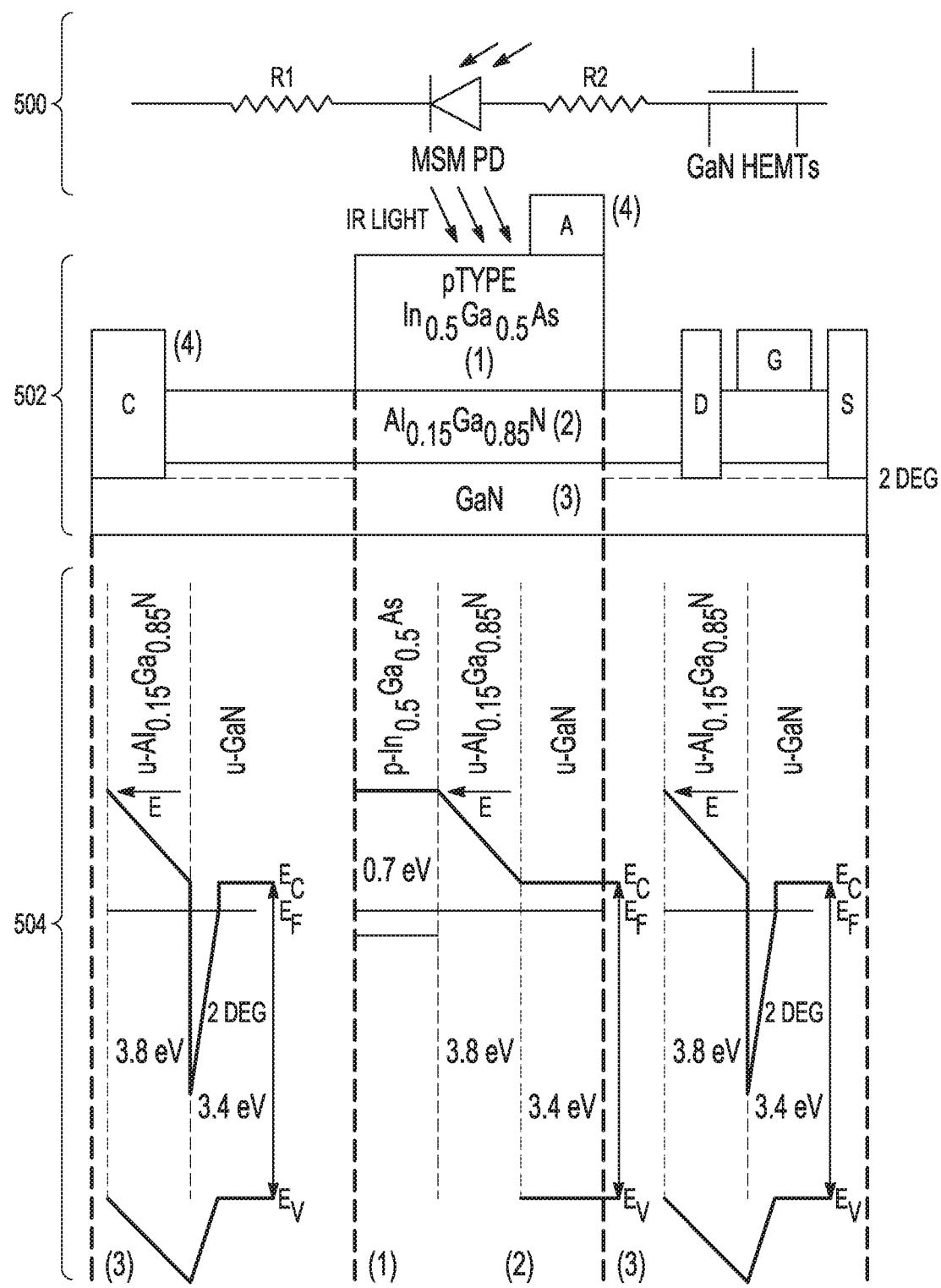
FIG. 5 is a conceptual diagram depicting a relationship between a schematic diagram of the hybrid semiconductor assembly, a structure of the hybrid semiconductor assembly, and an energy band diagram of the structure of the hybrid semiconductor assembly.

FIG. 5 is a conceptual diagram depicting a relationship between a schematic diagram of the hybrid semiconductor assembly, a structure of the hybrid semiconductor assembly, and an energy band diagram of the structure of the hybrid semiconductor assembly. The schematic diagram is shown at 500, the structure of the hybrid semiconductor assembly is shown at 502, and the energy band diagram is shown at 504. In particular, FIG. 5 depicts the mechanism of photodetection in the hybrid semiconductor photodetector assembly 502 at a 0V bias.

From left to right and corresponding to the schematic diagram 500, the assembly shown at 502 can be used to form a resistor R1, a photodiode MSM PD, a resistor R2, and a phototransistor, e.g., a GaN HEMT. The photodiode MSM PD can receive incident light, e.g., IR light. In particular, the absorber layer material shown as region (1), e.g., p-type $In_YGa_{(1-Y)}As$, can receive the incident light, e.g., IR light. In response to the incident light, electron-hole pairs can be generated in region (1). The electrons generated in region (1) can then be pushed into the region (2) by the internal electric field and collected in region (2), e.g., the $Al_XGa_{(1-X)}N$ layer, and transported and localized in region (3) at the interface between the $Al_XGa_{(1-X)}N$ layer and the GaN layer as a 2DEG channel. A photocurrent measurement can be taken at region (4) between the anode A and the cathode C.

As seen in FIG. 5, there is a discontinuity in the 2DEG channel in the GaN layer in region (3) thereby limiting the current conduction between the cathode and anode contacts in the range of femtoamps (fA) to nanoamps (nA), which can yield very low noise signal in the OFF operation of the photodetector. Furthermore, higher signal/noise ratio can then be expected due to a low noise signal.

Referring now to the energy band diagram 504, the energy band diagram 504 is divided into three portions that correspond from left to right to the schematic diagram 500 and the assembly shown at 502. A conduction band edge $E_C$, a Fermi level $E_F$, and a valence band edge $E_V$ are shown in each of the three portions.

Referring specifically to the middle portion that corresponds to the MSM photodiode, the absorber layer material, e.g., p-type $In_YGa_{(1-Y)}As$, label as region (1) in the energy band diagram, can have a band gap of about 0.7 eV that can be used for wavelengths around 1.5 μm, e.g., IR light. Other band gaps can be used, and thus other wavelengths can be received by adjusting the indium and gallium content.

As a result of the electric field E shown in region (2), e.g., $u-Al_XGa_{(1-X)}N$ of the energy band diagram, and because electrons will tend to go to a lower energy band, any electrons in region (1) will be transported through the region (2) and will be trapped in the region (3), e.g., the u-GaN material. In some example configurations, an optional back barrier layer can be included, such as shown in FIGS. 3A and 4A above.

In some example implementations it can be desirable to control the photodiode MSM PD with a switch, e.g., the phototransistor, such as shown at 500 in FIG. 5. Using the techniques of this disclosure, the photodiode and the phototransistor can be integrated on the same wafer to provide a monolithically integrated assembly, such as shown in FIGS. 3-5.

A compound semiconductor used to form the semiconductor devices described herein may include a chemical compound of elements from different groups in the periodic table. Such chemical compounds may include a pairing of elements from group III (the group comprising boron (B), aluminum (Al), gallium (Ga), indium (In), and thallium (Tl)) with elements from group V (the group comprising nitrogen (N), phosphorus (P), arsenic (As), antimony (Sb), and bismuth (Bi)). Group 3 of the periodic table may also be referred to as Group III and group 5 as Group V.

Without limitation, a semiconductor device may be fabricated from gallium nitride (GaN) and aluminum indium gallium nitride (AlInGaN). Additionally, a semiconductor device may be fabricated using AlN/GaN/AlN hetero-structures, InAlN/GaN, GaN/AlGaN, or other combinations of group 13 and group 15 elements. These hetero-structures may form a two-dimensional electron gas (2DEG) at the interface of the compound semiconductors that form heterostructure, such as the interface of GaN and AlGaN. The 2DEG may form a conductive channel of electrons that may be controllably depleted, such as by gate voltage metal contact disposed above the channel, to control a current through the semiconductor device.

In an example, the semiconductor device may be a field effect transistor, such as a high electron mobility transistor (HEMT), having source and drain terminals electrically coupled to a channel formed by a 2DEG, and a gate terminal disposed above the channel. A voltage on the gate terminal, determined relative to a voltage on the drain terminal, may induce an electric field into the channel to control the concentration of free electrons in the 2DEG, such as to control a flow of current through the transistor.

Figure 6A:
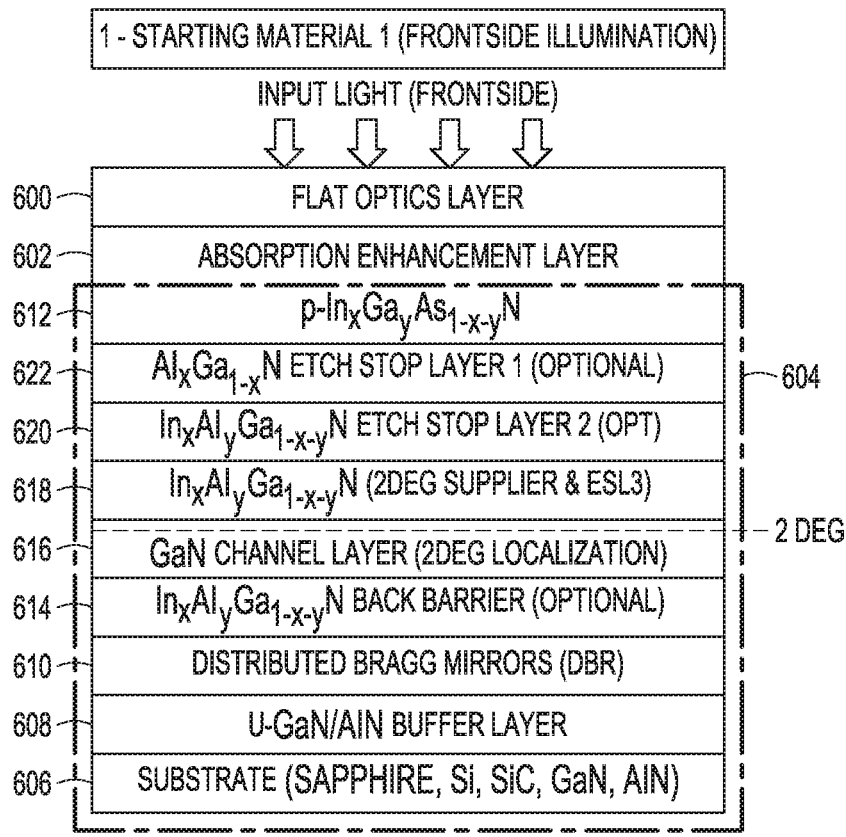
FIGS. 6A-6F depict an example of a process fabrication flow to produce a monolithically integrated hybrid semiconductor assembly in accordance with this disclosure.

FIGS. 6A-6F depict an example of a process fabrication flow to produce a monolithically integrated hybrid semiconductor assembly in accordance with this disclosure. As seen in FIG. 6A, the hybrid IR photodetector can begin with a first starting material ("starting material 1"), e.g., for frontside illumination, such as shown in FIGS. 6B-6F.

For the first starting material implementation, the starting material 1 can optionally include one or both of a flat optics layer 600 and an absorption enhancement layer 602, which can improve the absorption of light at the surface. The flat optics layer 600 can include, for example, metamaterial lens material to focus the light and the absorption enhancement layer can include an anti-reflective coating, for example.

The core assembly 604 can include a substrate 606, such as sapphire, silicon (Si), silicon carbide (SiC), GaN, or aluminum nitride (AlN). A buffer layer 608, e.g., u-GaN or AlN, can be deposited over the substrate. In addition, the core assembly 604 can include a distributed Bragg reflectors or mirror (DBR) layer 610 deposited over the buffer layer. The DBR layer can include multiple layers, 2 to 100 layers, of semiconductors having different indices of refraction n (e.g., n1 layer, n2 layer, n1 layer, n2 layer, n1 layer, n2 layer ... ) that can reflect a certain wavelength range, e.g. IR range. The DBR layer 610 can reflect light that was not absorbed by the p-type InGaAsN layer 612 back to the p-type InGaAsN layer 612, which will increase the likelihood of absorption, which can improve performance.

The core device 604 can include an optional back barrier layer 614, e.g., $In_xAl_yGa_{1-x-y}N$, deposited over the DBR layer 610. Next, a GaN channel layer 616 can be formed, e.g., on the optional back barrier layer 614, for 2DEG localization. Over the GaN channel layer 616, an $In_xAl_yGa_{1-x-y}N$ layer 618 can be formed as a 2DEG supplier and etch stop layer.

Two additional (and optional) etch stop layers can be formed over layer 618. For example, an optional $In_xAl_yGa_{1-x-y}N$ etch stop layer 620 can be formed over layer 618 and an optional $Al_xGa_{1-x}N$ etch stop layer 622 can be formed over the $In_xAl_yGa_{1-x-y}N$ etch stop layer 620. The layers 614-622 together can form an HEMT structure. On top of the HEMT structure, the p-type InGaAsN layer 612 can be formed for absorption.

FIGS. 6B-6F depict an example of a process fabrication flow using a continuous IR single or multiple grading InGaAs absorber layer for the starting material 1 of FIG. 6A.

Figure 6B:
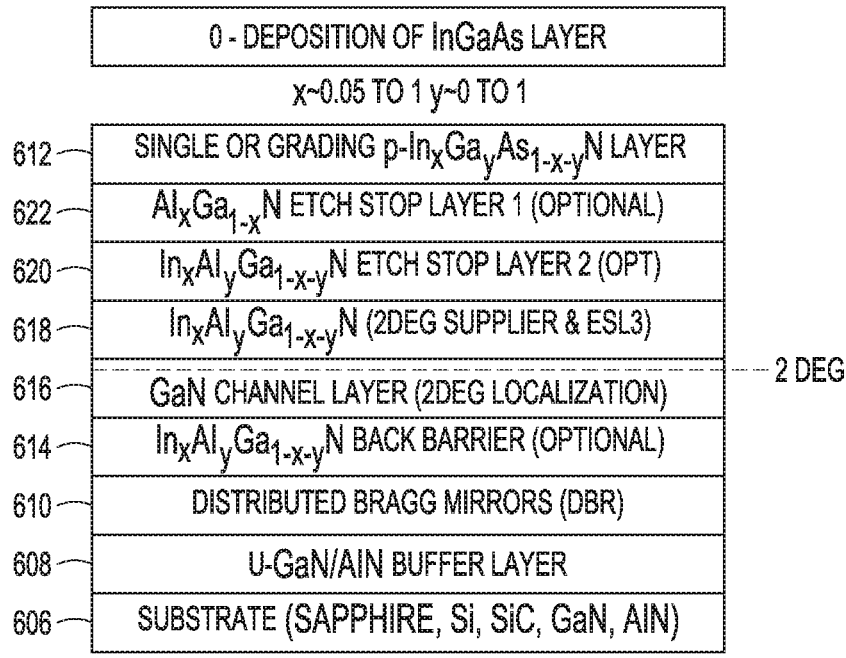

FIG. 6B depicts the deposition of the absorber material layer. As seen in the example of FIG. 6B, a layer 612 of p-type $In_xAl_yGa_{1-x-y}N$ is deposited over the optional $Al_xGa_{1-x}N$ etch stop layer 622, where x can be about 0.05 to 1 and y can be about 0 to 1.

Figure 6C:
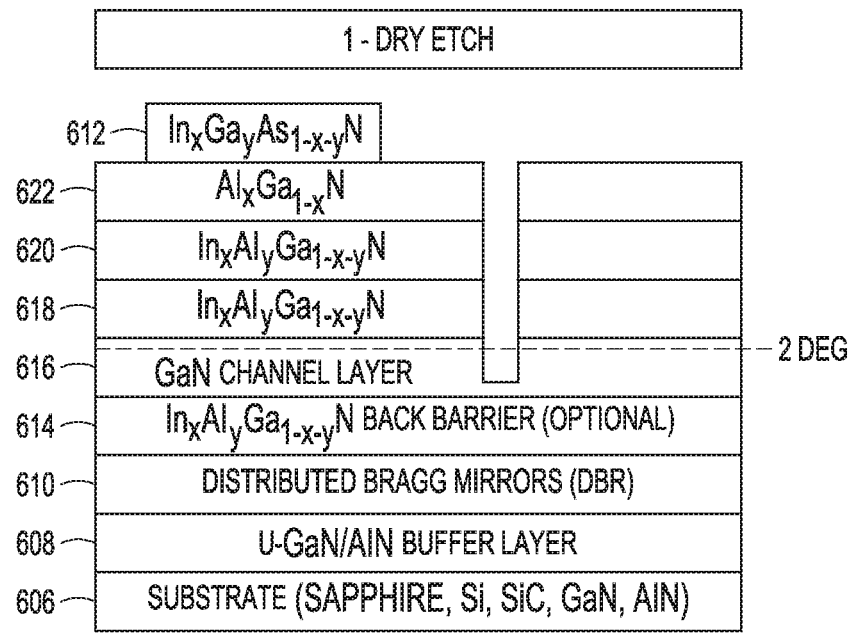

FIG. 6C depicts a first dry etching stage of the process fabrication flow. As seen in FIG. 6C, a portion of the layers 612 and 616-622 can be removed via a first etching to permit, for example, contacts to be formed.

Figure 6D:
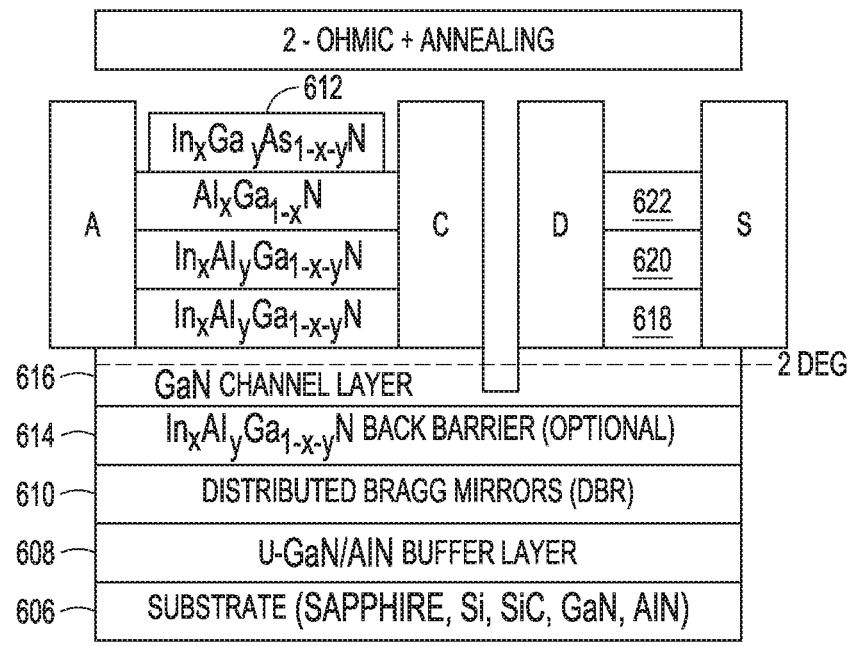

FIG. 6D depicts a formation of ohmic contacts of the process fabrication flow. Ohmic contacts A, C, D, and S, e.g., titanium (Ti) or gold (Au), can be formed and coupled with the GaN channel layer 616.

Figure 6E:
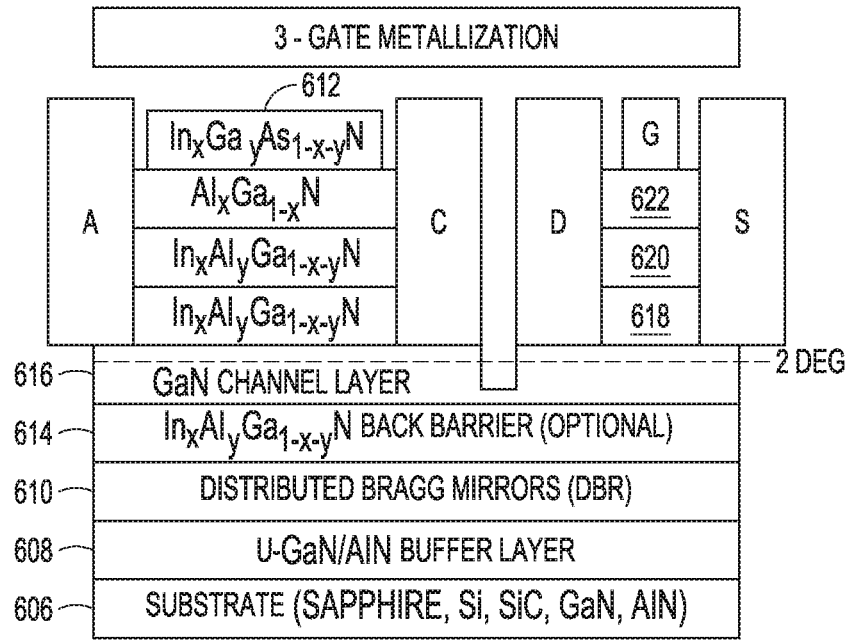

FIG. 6E depicts a gate metallization of the process fabrication flow. As seen, a gate contact G can be formed and coupled with the optional $Al_xGa_{1-x}N$ etch stop layer 622.

Figure 6F:
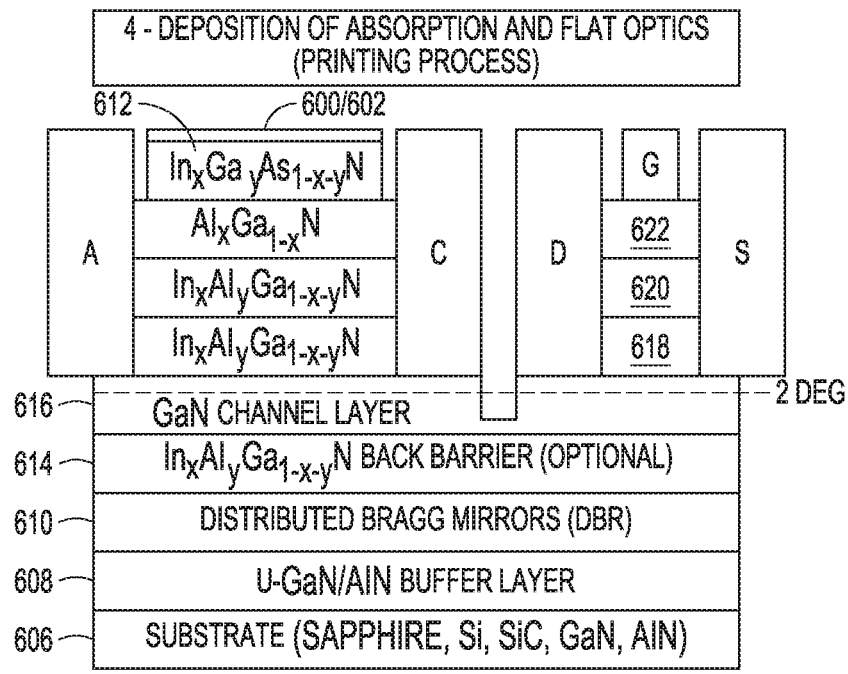

FIG. 6F depicts a deposition of the optional absorption layer and flat optics layer of the process fabrication flow. As mentioned above, the starting material 1 of FIG. 6A can optionally include one or both of the flat optics layer 600 and an absorption enhancement layer 602, which can improve the absorption of light at the surface. The flat optics layer 600 can include, for example, metamaterial lens material to focus the light and the absorption enhancement layer 602 can include an anti-reflective coating, for example. These layers 600 and/or 602 can be deposited over the layer 612 of p-type $In_xAl_yGa_{1-x-y}N$.

Figure 7A:
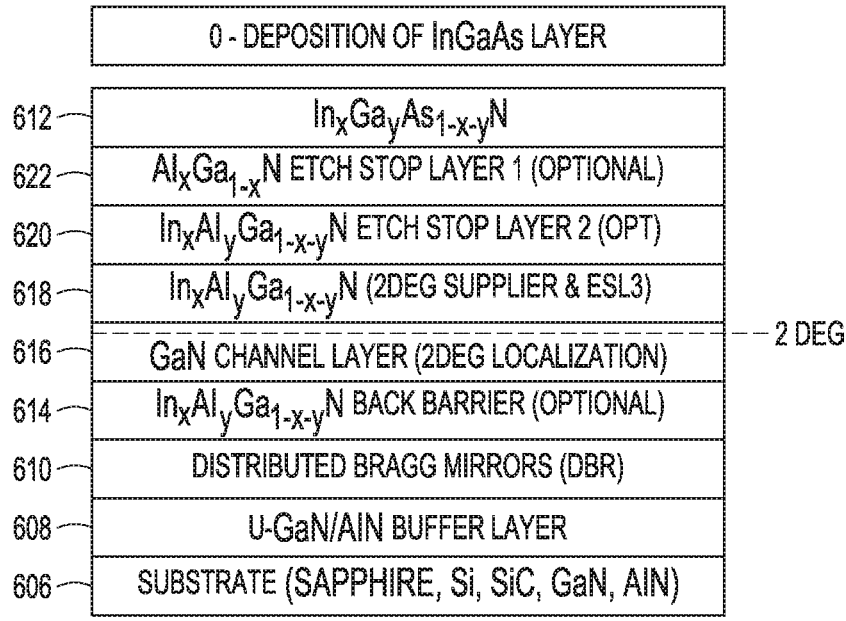
FIGS. 7A-7D depict another example of a process fabrication flow to produce a monolithically integrated hybrid semiconductor assembly in accordance with this disclosure.

FIGS. 7A-7D depict another example of a process fabrication flow to produce a monolithically integrated hybrid semiconductor assembly in accordance with this disclosure. In particular, FIGS. 7A-7D depict an example of a process fabrication flow using a discontinuous IR single or multiple grading InGaAs absorber layer for the starting material 1 of FIG. 6A. The layers shown in FIG. 7A are similar to those shown in FIG. 6B and, for purposes of conciseness, will not be described again.

Figure 7B:
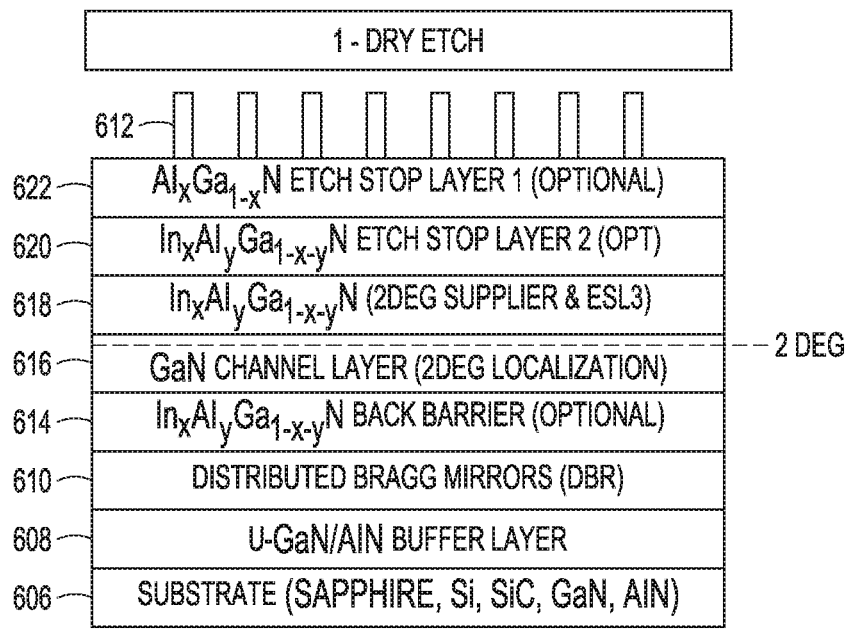

FIG. 7B depicts a dry etching stage of the process fabrication flow. As seen in FIG. 7B, portions of the layer 612 of p-type $In_xAl_yGa_{1-x-y}N$ can be removed via a first etching to begin formation of the waveguides.

Figure 7C:
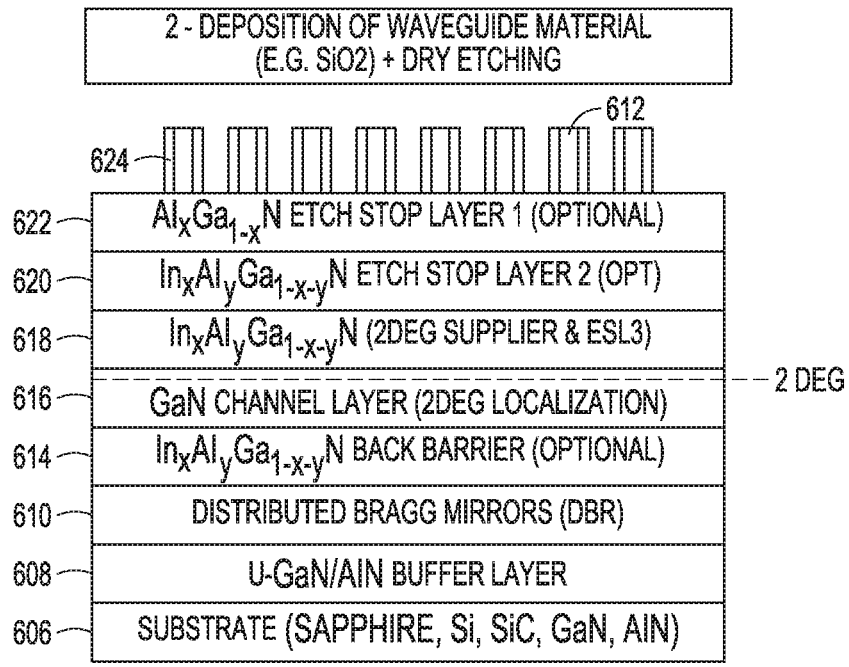

FIG. 7C depicts a deposition and dry etching stage of the process fabrication flow. Waveguide material 624, e.g., silicon dioxide ($SiO_2$), can be deposited adjacent the remaining p-type $In_xAl_yGa_{1-x-y}N$ material in layer 612.

Figure 7D:
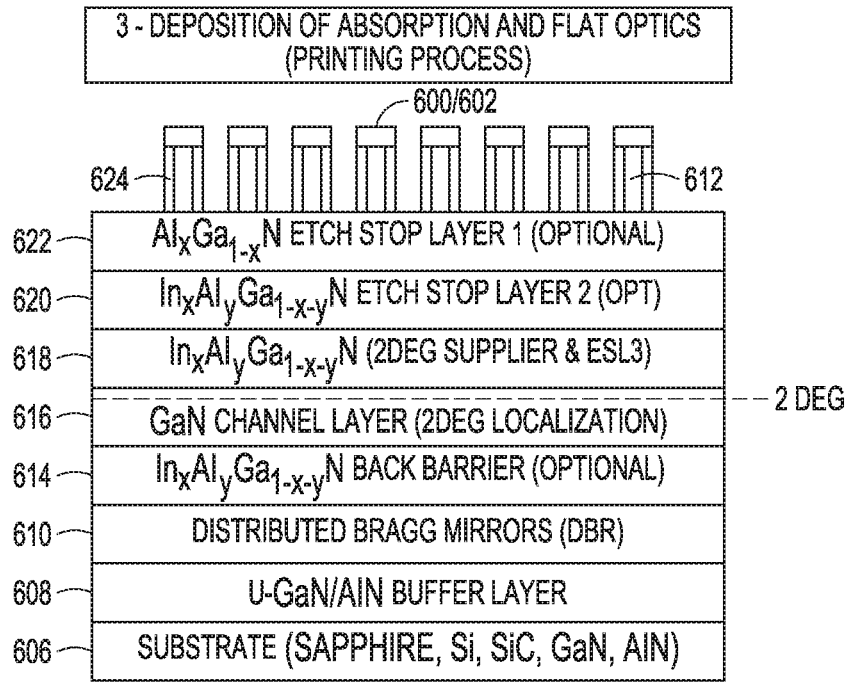

FIG. 7D depicts a deposition of the optional absorption and flat optics layers of the process fabrication flow. As mentioned above, the starting material 1 of FIG. 6A can optionally include one or both of the flat optics layer 600 and an absorption enhancement layer 602, which can improve the absorption of light at the surface. The flat optics layer can include, for example, metamaterial lens material to focus the light and the absorption enhancement layer can include an anti-reflective coating, for example. One or both of these layers 600, 602 can be deposited over the layer 612 of p-type $In_xAl_yGa_{1-x-y}N$ and waveguide material 624 shown in FIG. 7D.

Figure 8A:
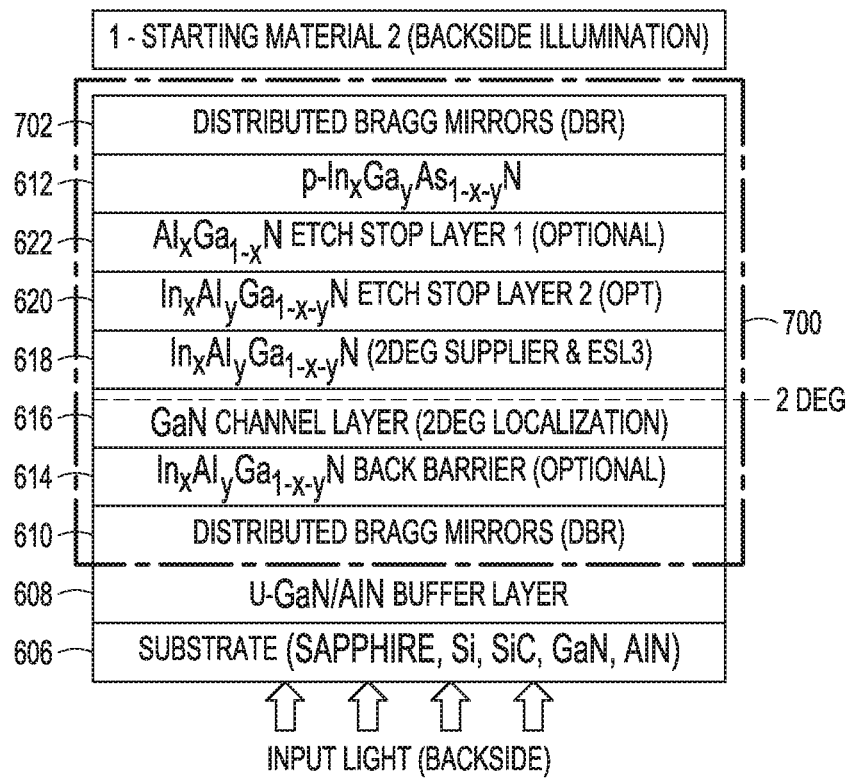
FIGS. 8A-8E depict another example of a process fabrication flow to produce a monolithically integrated hybrid semiconductor assembly in accordance with this disclosure.

FIGS. 8A-8E depict another example of a process fabrication flow to produce a monolithically integrated hybrid semiconductor assembly in accordance with this disclosure. As seen in FIG. 8A, the hybrid IR photodetector can begin with a second starting material ("starting material 2"), e.g., for backside illumination, such as shown in FIGS. 8A-8E.

For the second starting material implementation ("starting material 2"), the substrate 606 should be transparent to the desired wavelengths, IR light, such as sapphire, silicon (Si), silicon carbide (SiC), GaN, or aluminum nitride (AlN). The core device 700 can include a buffer layer 608 and a first DBR layer 610 that will pass only the wavelengths of interest, e.g., IR light. The wavelengths of light that have passed through the DBR layer 610 will travel through all the layers until the p-type InGaAsN layer 612 where it can be absorbed and converted into electron-hole pairs. The electron-hole pairs can be transported through the AlGaN/GaN layers, as described above.

The core device 700 can include an optional back barrier layer 614, e.g., $In_xAl_yGa_{1-x-y}N$, deposited over the DBR layer 610. Next, a GaN channel layer 616 can be formed, e.g., on the optional back barrier layer 614, for 2DEG localization. Over the GaN channel layer 616, an $In_xAl_yGa_{1-x-y}N$ layer 618 can be formed as a 2DEG supplier and etch stop layer.

Two additional (and optional) etch stop layers can be formed over layer 618. For example, an optional $In_xAl_yGa_{1-x-y}N$ etch stop layer 620 can be formed over layer 618 and an optional $Al_xGa_{1-x}N$ etch stop layer 622 can be formed over the $In_xAl_yGa_{1-x-y}N$ etch stop layer 620. The p-type InGaAsN layer 612 can be formed on top of the $Al_xGa_{1-x}N$ etch stop layer 622, for absorption.

The core device 700 can include a second DBR layer 702 coupled to the InGaAsN layer 612. The second DBR layer 702 can reflect light that was not absorbed by the p-type InGaAs 612 back to the p-type InGaAsN layer 612, which can increase the likelihood of absorption, which can improve performance.

Figure 8B:
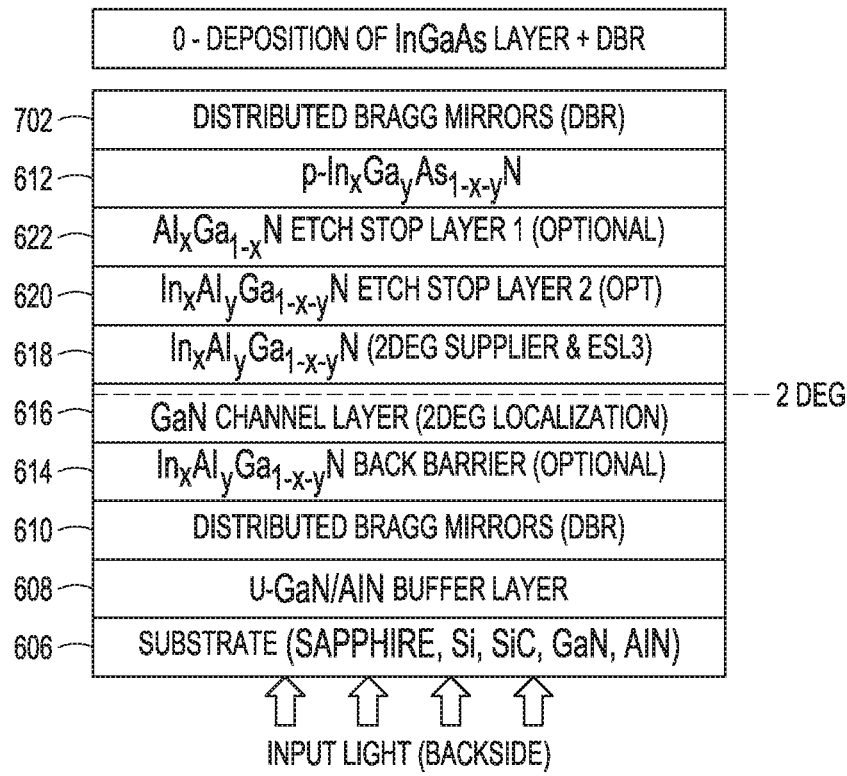

FIG. 8B depicts the deposition of the absorber material layer and the distributed. Bragg reflector layer. As seen in the example of FIG. 8B, a layer 612 of p-type $In_xAl_yGa_{1-x-y}N$ is deposited over the optional $Al_xGa_{1-x}N$ etch stop layer 622, where x can be about 0.05 to 1 and y can be about 0 to 1. The DBR layer 702 can be deposited over the $In_xAl_yGa_{1-x-y}N$ layer 612.

Figure 8C:
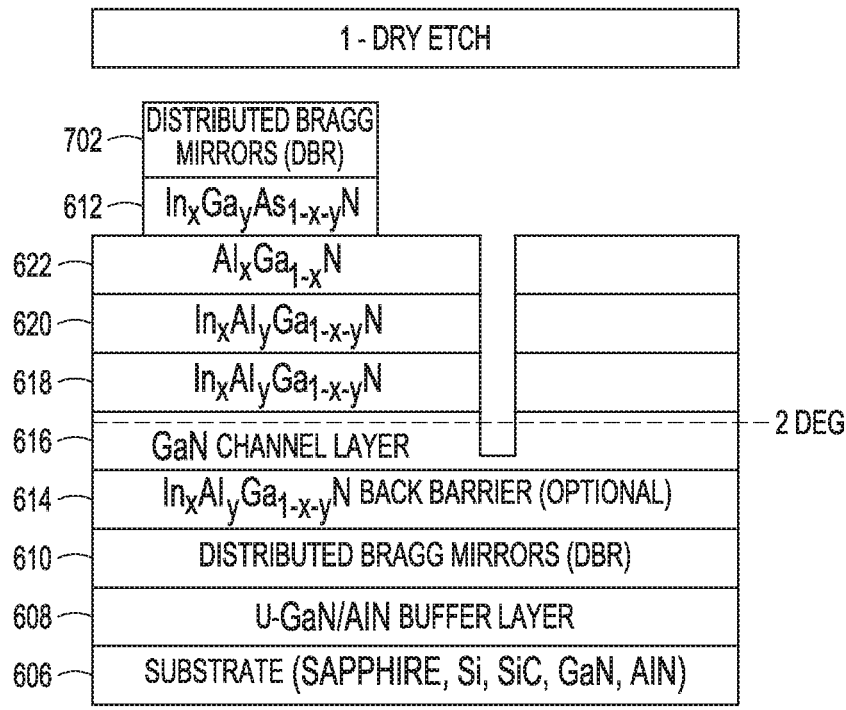

FIG. 8C depicts a first dry etching stage of the process fabrication flow. As seen in FIG. 8C, a portion of the layers 702, 612, and 616-622 can be removed via a first etching to permit, for example, contacts to be formed.

Figure 8D:
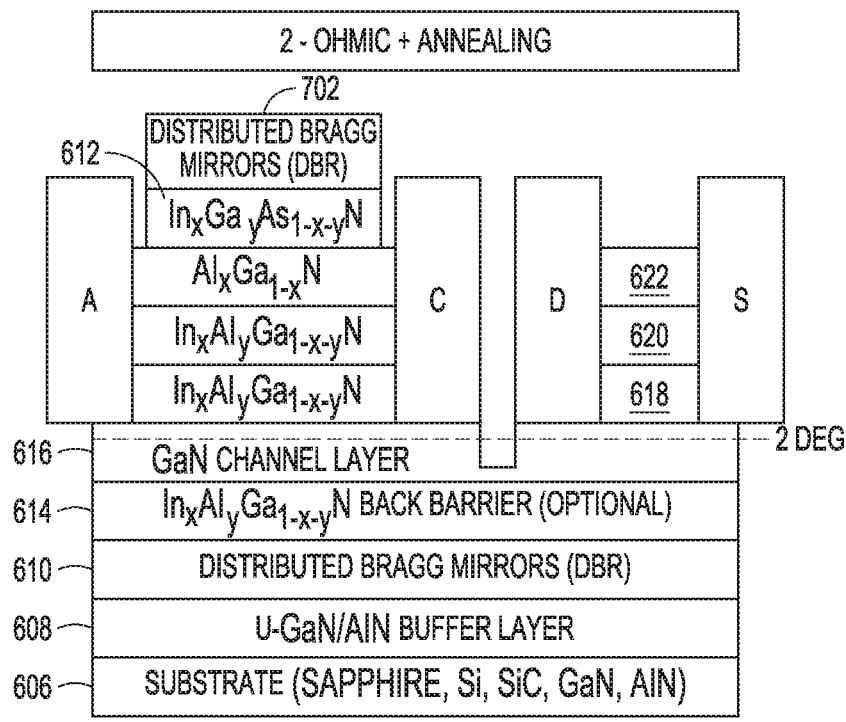

FIG. 8D depicts a formation of ohmic contacts of the process fabrication flow. Ohmic contacts A, C, D, and S, e.g., titanium (Ti) or gold (Au), can be formed and coupled with the GaN channel layer 616.

Figure 8E:
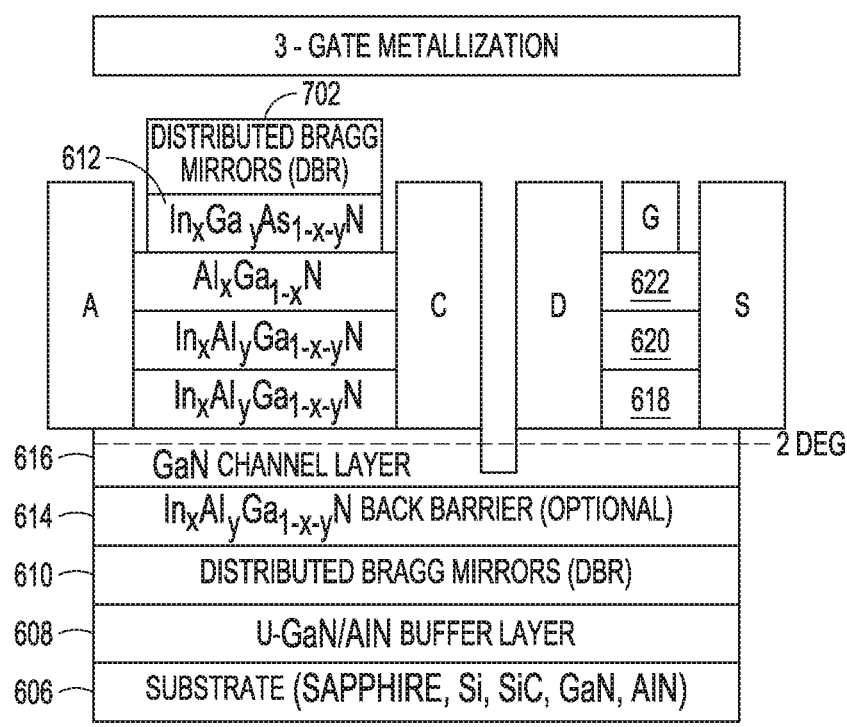

FIG. 8E depicts a gate metallization of the process fabrication flow. As seen, a gate contact G can be formed and coupled with the optional $Al_xGa_{1-x}N$ etch stop layer 622.

Figure 9A:
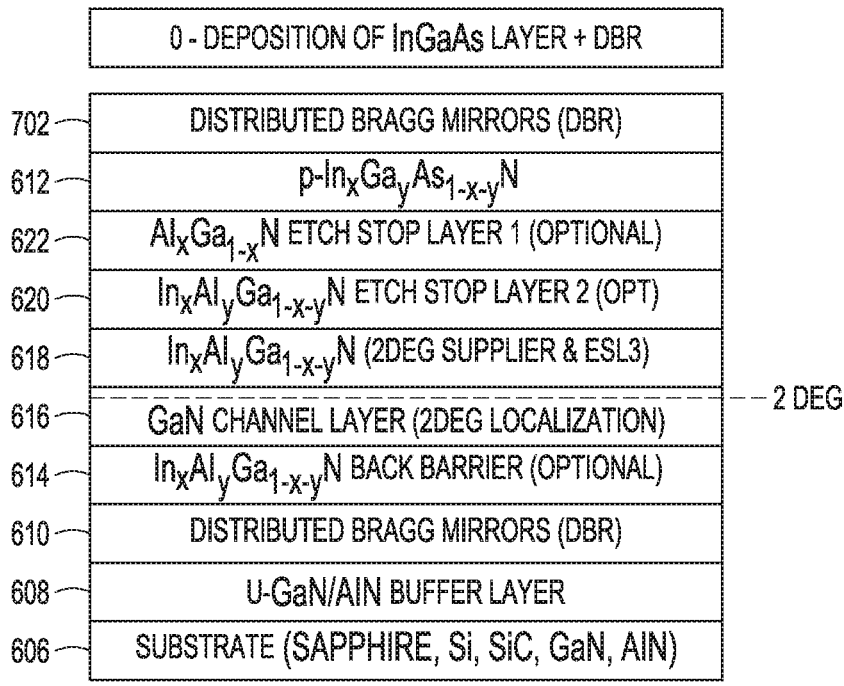
FIGS. 9A-9D depict another example of a process fabrication flow to produce a monolithically integrated hybrid semiconductor assembly in accordance with this disclosure.

FIGS. 9A-9D depict another example of a process fabrication flow using the second starting material of FIG. 8A. The layers shown in FIG. 9A are similar to those shown in FIG. 8B and, for purposes of conciseness, will not be described again.

FIG. 9A depicts the deposition of the absorber material layer and the distributed Bragg reflector layer. As seen in the example of FIG. 9A, a layer 612 of p-type $In_xAl_yGa_{1-x-y}N$ is deposited over the optional $Al_xGa_{1-x}N$ etch stop layer 622, where x can be about 0.05 to 1 and y can be about 0 to 1. The DBR layer 702 can be deposited over the $In_xAl_yGa_{1-x-y}N$ layer 612.

Figure 9B:
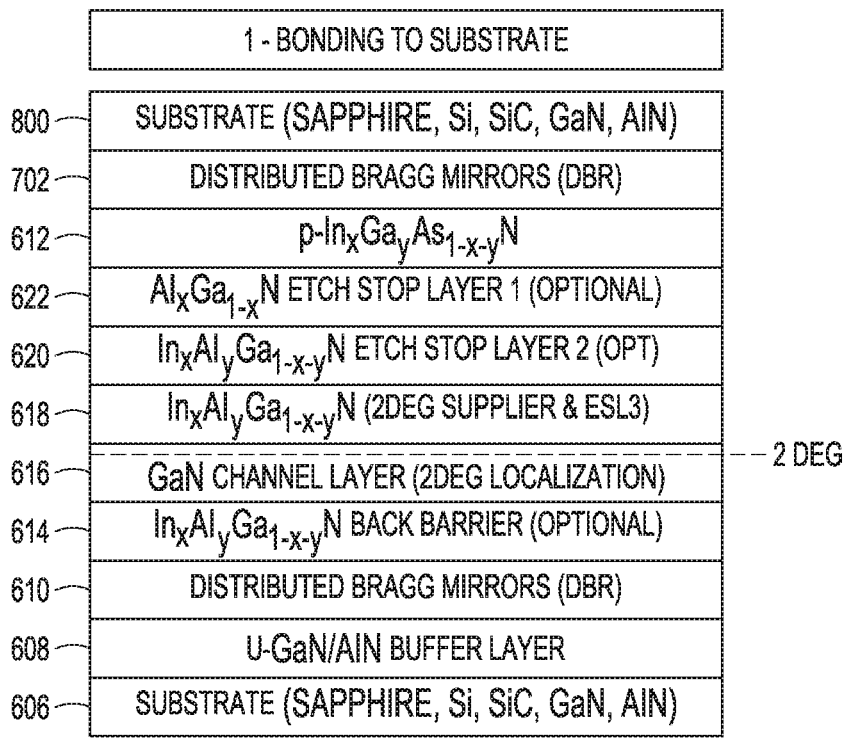

FIG. 9B depicts a stage of bonding to a substrate of the process fabrication flow. As seen in FIG. 9B, a substrate 800, such as metal, sapphire, silicon (Si), silicon carbide (SiC), GaN, or aluminum nitride (AlN), can be bonded to the DBR layer 702.

Figure 9C:
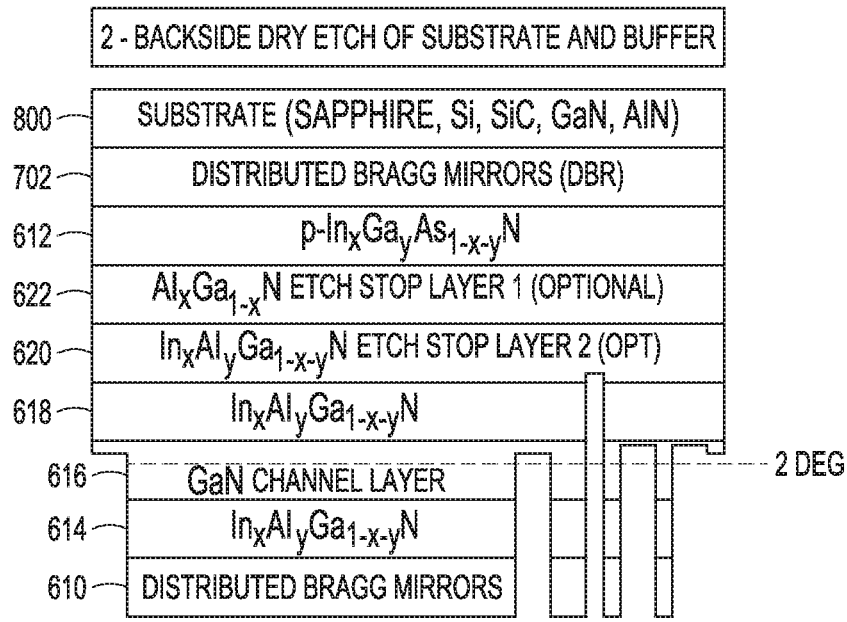

FIG. 9C depicts a back side dry etching stage of the process fabrication flow. As seen in FIG. 9C, the substrate layer 606 and buffer layer 608 of FIG. 9B are etched away and a portion of the layers 610 and 614-620 can be removed via etching to permit, for example, contacts to be formed.

Figure 9D:
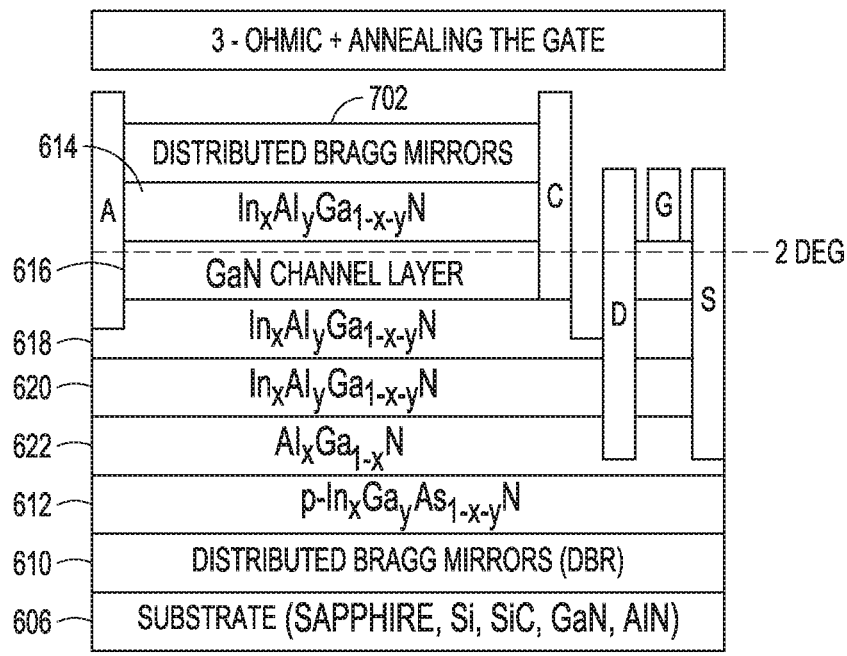

FIG. 9D depicts a formation of ohmic contacts of the process fabrication flow. Ohmic contacts A, C, D, S, and G, e.g., titanium (Ti) or gold (Au), can be formed. For example, the gate contact G can be formed and coupled with the GaN channel layer 616. In addition, the contacts D and S can be coupled to the optional $Al_xGa_{1-x}N$ etch stop layer 622, and the contacts A and C can be coupled to the $In_xAl_yGa_{1-x-y}N$ layer 618.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art, upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined The claimed invention is:

1. A semiconductor photodetector assembly configured to operate in response to light received at one or more input wavelengths, the assembly comprising:
   a semiconductor absorber layer material of the semiconductor photodetector assembly, the semiconductor absorber layer material configured to receive the light at the one or more input wavelengths and generate electron-hole pairs, wherein the semiconductor absorber layer material of the semiconductor photodetector assembly includes material from a first semiconductor family;
   a first wide band gap semiconductor transducer layer material coupled to the semiconductor absorber layer material of the semiconductor photodetector assembly, wherein the first transducer layer material is from a second semiconductor family different from the first semiconductor family;
   a second transducer layer material coupled between the first transducer layer material and the semiconductor absorber layer material of the semiconductor photodetector assembly;
   a first contact material coupled to an interface between the first transducer layer material and the second transducer layer;
   a second contact material spaced apart from the first contact material, the second contact material coupled to the interface,
   wherein the semiconductor absorber layer material of the semiconductor photodetector assembly extends partially between the first contact material and the second contact material such as to avoid electrical conduction between the first contact material and the second contact material,
   wherein, in a first state, a discontinuous two-dimensional electron gas (2DEG) channel is formed between the first contact material and the second contact material and at the interface between the first transducer layer material and the second transducer layer material, wherein a discontinuity in the 2DEG channel is below and aligned with the semiconductor absorber layer material of the semiconductor photodetector assembly, and
   wherein, in a second state and in response to the light received by the semiconductor absorber layer material of the semiconductor photodetector assembly at the one or more input wavelengths, the first transducer layer material is configured to collect electrons from the semiconductor absorber layer material of the semiconductor photodetector assembly and form a continuous 2DEG channel between the first contact material and the second contact material.

2. The assembly of claim 1, wherein the one or more input wavelengths include infrared (IR) light.

3. The assembly of claim 2, wherein the one or more input wavelengths include wavelengths of 1.5 micrometers and greater.

4. The assembly of claim 1, wherein the semiconductor absorber layer material of the semiconductor photodetector assembly includes gallium arsenide and the first transducer layer material includes gallium nitride.

5. The assembly of claim 4, wherein the semiconductor absorber layer of the semiconductor photodetector assembly further includes indium.

6. The assembly of claim 4, wherein the second transducer layer material further includes aluminum.

7. The assembly of claim 6, wherein the second transducer layer material includes gallium nitride, the assembly further comprising:
   a substrate material coupled to the first transducer layer material.

8. The assembly of claim 1, wherein the semiconductor absorber layer material of the semiconductor photodetector assembly includes gallium arsenide and the first transducer layer material does not include gallium arsenide.

9. The assembly of claim 1, further comprising:
   a first contact material coupled to an interface between the first transducer layer material and a second transducer layer;
   a second contact material spaced apart from the first contact material, the second contact material coupled to the interface,
   wherein the 2DEG channel includes a plurality of interdigitated 2DEG channels extending partially from one of the first contact material and the second contact material to the other of the first contact material and the second contact material.

10. The assembly of claim 1, wherein the photodetector assembly includes a photodiode.

11. The assembly of claim 1, wherein the photodetector assembly includes a phototransistor.

12. The assembly of claim 1, wherein the photodetector assembly includes a photodiode and a phototransistor.

13. The assembly of claim 1, further comprising a back barrier layer material coupled between the first transducer layer material and a substrate layer.

14. The assembly of claim 13, wherein the back barrier layer material includes aluminum nitride.

15. A method of forming a semiconductor photodetector assembly configured to receive light at one or more wavelengths, the method comprising:
   coupling a first wide band gap semiconductor transducer layer material and a second transducer layer material to a substrate material, wherein the first transducer layer material is from a first semiconductor family;
   coupling a first contact material to an interface between the first transducer layer material and the second transducer layer;
   coupling a second contact material to the interface, the second contact material spaced apart from the first contact material;
   coupling a semiconductor absorber layer material of the semiconductor photodetector assembly to the second transducer layer material, wherein the semiconductor absorber layer material of the semiconductor photodetector assembly includes material from a second semiconductor family different from the first semiconductor family, and wherein the semiconductor absorber layer material of the semiconductor photodetector assembly extends partially between the first contact material and the second contact material such as to avoid electrical conduction between the first contact material and the second contact material,
   in a first state, forming a discontinuous two-dimensional electron gas (2DEG) channel between the first contact material and the second contact material and at the interface between the first transducer layer material and the second transducer layer material, wherein a discontinuity in the 2DEG channel is below and aligned with the semiconductor absorber layer material of the semiconductor photodetector assembly, and in a second state and in response to the light received by the semiconductor absorber layer material of the semiconductor photodetector assembly at the one or more input wavelengths, forming a continuous 2DEG channel between the first contact material and the second contact material.

16. The method of claim 15, wherein the semiconductor absorber layer material of the semiconductor photodetector assembly includes gallium arsenide and the first transducer layer material includes gallium nitride.

17. The method of claim 16, wherein the semiconductor absorber layer of the semiconductor photodetector assembly further includes indium.

18. The method of claim 16, wherein the first transducer layer material further includes aluminum.

19. A semiconductor photodetector assembly configured to operate in response to light received at one or more input wavelengths, the assembly comprising:
- a semiconductor absorber layer material of the semiconductor photodetector assembly configured to receive the light at the one or more input wavelengths and generate electron-hole pairs, wherein the semiconductor absorber layer material of the semiconductor photodetector assembly includes material from a first semiconductor family; and
- a wide band gap semiconductor transducer layer material of the semiconductor photodetector assembly coupled to the semiconductor absorber layer material of the semiconductor photodetector assembly, wherein the transducer layer material is configured to collect electrons from the semiconductor absorber layer material of the semiconductor photodetector assembly and form a two-dimensional electron gas (2DEG) channel, and wherein the transducer layer material is from a second semiconductor family different from the first semiconductor family,
wherein the transducer layer material is a first transducer layer material, the assembly further comprising:
- a first contact material coupled to an interface between the first transducer layer material and a second transducer layer;
- a second contact material spaced apart from the first contact material, the second contact material coupled to the interface,
wherein the 2DEG channel includes a plurality of interdigitated 2DEG channels extending partially from one of the first contact material and the second contact material to the other of the first contact material and the second contact material.

20. The assembly of claim 19, wherein the photodetector assembly includes one or both of a photodiode and a phototransistor.

21. The assembly of claim 19, wherein the one or more input wavelengths include infrared (IR) light.

* * * * *